(12) United States Patent
Xiao

(10) Patent No.: US 10,042,211 B2
(45) Date of Patent: Aug. 7, 2018

(54) LIQUID CRYSTAL DISPLAY PANEL, ARRAY SUBSTRATE AND MANUFACTURING METHOD THEREOF

(71) Applicants: Shenzhen China Star Optoelectronics Technology Co., Ltd., Shenzhen, Guangdong (CN); Wuhan China Star Optoelectronics Technology Co., Ltd., Wuhan, Hubei (CN)

(72) Inventor: Juncheng Xiao, Guangdong (CN)

(73) Assignees: Shenzhen China Star Optoelectronics Technology Co., Ltd, Shenzhen, Guangdong (CN); Wuhan China Star Optoelectronics Technology Co., Ltd, Wuhan, Hubei (CN)

( * ) Notice: Subject to any disclaimer, the term of this patent is extended or adjusted under 35 U.S.C. 154(b) by 256 days.

(21) Appl. No.: 14/890,677

(22) PCT Filed: Oct. 21, 2015

(86) PCT No.: PCT/CN2015/092353
§ 371 (c)(1),
(2) Date: Nov. 12, 2015

(87) PCT Pub. No.: WO2017/054259
PCT Pub. Date: Apr. 6, 2017

(65) Prior Publication Data
US 2017/0184887 A1    Jun. 29, 2017

(30) Foreign Application Priority Data

Sep. 30, 2015 (CN) .......................... 2015 1 0646037

(51) Int. Cl.
*G02F 1/1339* (2006.01)
*G02F 1/01* (2006.01)
(Continued)

(52) U.S. Cl.
CPC .......... *G02F 1/1339* (2013.01); *G02F 1/0107* (2013.01); *H01L 21/02123* (2013.01);
(Continued)

(58) Field of Classification Search
CPC ................. G02F 1/1339; G02F 1/0107; G02F 2001/13396; G02F 2001/13398; H01L 21/02123; H01L 21/02225; H01L 21/0425
See application file for complete search history.

(56) References Cited

U.S. PATENT DOCUMENTS

| 2014/0138694 A1* | 5/2014 | Choi | ................... H01L 29/4908 257/71 |
| 2014/0232955 A1* | 8/2014 | Roudbari | ................ G06F 3/041 349/12 |

FOREIGN PATENT DOCUMENTS

| CN | 101840865 A | * | 9/2010 |
| CN | 101840865 A | | 9/2010 |

(Continued)

*Primary Examiner* — Nathanael R Briggs
(74) *Attorney, Agent, or Firm* — Andrew C. Cheng

(57) ABSTRACT

The disclosure provides a liquid crystal display panel, an array substrate and a manufacturing method thereof. In the method, controllable resistance spacer layers are formed on at least one of a source doped region and a drain doped region of a low temperature polysilicon active layer, wherein when a turn-on signal is not applied to the gate layer, the controllable resistance spacer layers serve as a blocking action for a flowing current, and when the turn-on signal is applied to the gate layer, the controllable resistance spacer layers serve as a conducting action for the flowing current, such that a contact region formed of the controllable resistance spacer layers is connected the corresponding source layer and the corresponding drain through the controllable resistance spacer layers. Therefore, the disclosure is capable of effectively decreasing a leakage of a thin film transistor.

6 Claims, 8 Drawing Sheets

(51) Int. Cl.
*H01L 21/02* (2006.01)
*H01L 21/04* (2006.01)

(52) U.S. Cl.
CPC .... *H01L 21/02225* (2013.01); *H01L 21/0425* (2013.01); *G02F 2001/13396* (2013.01); *G02F 2001/13398* (2013.01)

(56) References Cited

FOREIGN PATENT DOCUMENTS

| CN | 104538402 A | 4/2015 |
|---|---|---|
| JP | 1997321305 | 12/1997 |
| JP | 20100098149 | 4/2010 |

* cited by examiner

US 10,042,211 B2

LIQUID CRYSTAL DISPLAY PANEL, ARRAY SUBSTRATE AND MANUFACTURING METHOD THEREOF

BACKGROUND

Technical Field

The disclosure is related to display technology field, and more particular to a liquid crystal display panel, an array substrate and a manufacturing method thereof.

Related Art

The low temperature polysilicon (LTPS) technique is another new technique in the field of flat panel display, which is the next-generation technique after the amorphous silicon (a-Si). The low temperature polysilicon type display panel has advantages of the faster electron mobility, the smaller area of the film circuit, the higher resolution, the lower power consumption, the higher stability, etc.

The low temperature polysilicon type display panel means the display panel is manufactured by an active layer of the thin film transistor (TFT) using the low temperature polysilicon. The temperature of manufacturing process of the low temperature polysilicon thin film transistor is usually less than 600° C., it is suitable to the ordinary glass substrate, and the manner of the excimer laser annealing and excimer laser crystallization are usually used, and laser irradiation is performed for the amorphous silicon by using the certain energy of the excimer laser, such that the amorphous silicon crystallization is transformed into a polysilicon.

For the low temperature polysilicon thin film transistor, the leakage is an important factor for affecting the performance of the thin film transistor and a display effect of the display panel. If the leakage occurs in the thin film transistor, it is easily to have the problems of the decreased contrast, the flicker and the crosstalk. Therefore, how to effectively decrease the leakage of the low temperature polysilicon thin film transistor urgently becomes a technical problem to solve.

SUMMARY

A technical problem mainly solved by the disclosure is to provide a liquid crystal display panel, an array substrate and a manufacturing method thereof, thereby being capable of effectively decreasing a leakage of a thin film transistor.

In order to solve the above problems, a technique scheme of the disclosure provides a manufacturing method of an array substrate, which includes: forming a buffer layer on a substrate; forming a low temperature polysilicon active layer on the buffer layer by using a first mask; forming a gate insulating layer on the low-temperature polysilicon active layer; forming a gate layer on the gate insulating layer by using a second mask; forming an inter layer dielectric layer on the gate layer using a third mask, and forming two vias on the inter layer dielectric layer; removing a portion of the gate insulating layer respectively corresponding to two vias of the inter layer dielectric layer to expose two portions of the low temperature polysilicon active layer; performing an ion doping process for the two exposed portion of the low temperature polysilicon active layer to respectively form a source doped region and a drain doped region of the low temperature polysilicon active layer; forming controllable resistance spacer layers on the source doped region and a drain doped region respectively, and forming two controllable resistance spacer layers respectively corresponding to a source layer and a drain layer on the inter layer dielectric layer by using a fourth mask; forming the source layer and the drain layer respectively on the two controllable resistance spacer layers of the inter layer dielectric layer by using the fourth mask, such that the source layer and the drain are respectively connected to the source doped region and the drain doped region through the two vias of the inter layer dielectric layer, wherein the source layer and the drain layer are respectively connected to the source doped region and the drain doped region through the controllable resistance spacer layers of the source doped region and the drain doped region; forming a first insulating layer on the source layer and the drain layer by using a fifth mask and exposing a portion of the drain layer; forming a first transparent electrode layer on the first insulating layer by using a sixth mask, and the first transparent electrode layer does not cover the exposed drain layer and is not connect to the exposed drain layer; forming a second insulating layer on the first transparent electrode layer by using a seventh mask, and the second insulating layer does not cover the exposed drain layer and is not connect to the exposed drain layer; forming a second transparent electrode layer on the second insulating layer by using an eighth mask, such that the second transparent electrode layer is connected to the exposed drain layer; wherein, when a turn-on signal is not applied to the gate layer, the controllable resistance spacer layers serve as a blocking action for a flowing current, and when the turn-on signal is applied to the gate layer, the controllable resistance spacer layers serve as a conducting action for the flowing current.

In one embodiment, the controllable resistance spacer layers are an amorphous silicon layer; the step of performing the ion doping process for the two exposed portion of the low temperature polysilicon active layer comprising: performing an ion implantation for the two exposed portion of the low temperature polysilicon active layer, and a concentration of an implanted ion is greater than or equal to a first predetermined value, the implanted ion is a boron ion, a phosphorus ion or an arsenic ion.

In one embodiment, the controllable resistance spacer layers are an amorphous silicon layer; the step of performing the ion doping process for the two exposed portion of the low temperature polysilicon active layer comprising: performing an ion implantation for the two exposed portion of the low temperature polysilicon active layer, and a concentration of an implanted ion is less than a first predetermined value, the implanted ion is a boron ion, a phosphorus ion or an arsenic ion; the step after the step of performing the ion doping process for the two exposed portion of the low temperature polysilicon active layer comprising: performing an ion implantation for the controllable resistance spacer layers of the source doped region and the drain doped region, and a concentration of an implanted ion is greater than or equal to a second predetermined value.

In order to solve the above problems, another technique scheme of the disclosure provides an array substrate, which includes: a low temperature polysilicon active layer, a gate layer, an inter layer dielectric layer, a source layer and a drain layer formed on a substrate, the inter layer dielectric layer is disposed on the low temperature polysilicon active layer, the source layer and the drain layer is disposed on the inter layer dielectric layer, the gate layer is disposed under the low temperature polysilicon active layer and between the low temperature polysilicon active layer and the inter layer dielectric layer; two vias are disposed on the inter layer dielectric layer, the low temperature polysilicon active layer comprises a source doped region and a drain doped region, the source layer and the drain layer are respectively connected to the source doped region and the drain doped region through the two vias of the inter layer dielectric layer, and controllable resistance spacer layers are disposed between the source layer and the source doped region or between the drain layer and the drain doped region, wherein when a turn-on signal is not applied to the gate layer, the controllable resistance spacer layers serve as a blocking action for a flowing current, and when the turn-on signal is applied to the gate layer, the controllable resistance spacer layers serve as a conducting action for the flowing current.

In one embodiment, the controllable resistance spacer layers are respectively disposed between the source layer and the source doped region, between the drain layer and the drain doped region, between the source layer and the inter layer dielectric layer and between the drain layer and the inter layer dielectric layer.

In one embodiment, the controllable resistance spacer layers are an amorphous silicon layer, a concentration of an implanted ion of the source doped region and the drain doped region is greater than or equal to a first predetermined value, and the implanted ion is a boron ion, a phosphorus ion or an arsenic ion.

In one embodiment, the controllable resistance spacer layers are an amorphous silicon layer, a concentration of an implanted ion of the source doped region and the drain doped region is less than a first predetermined value, and the implanted ion is a boron ion, a phosphorus ion or an arsenic ion; an implanted ion with a concentration greater than or equal to a second predetermined value is doped to a side of the controllable resistance spacer layers positioned between the source layer and the source doped region near the source layer, an implanted ion with a concentration greater than or equal to a second predetermined value is doped to the drain layer and the drain doped region near the drain layer, and the implanted ion with the concentration greater than or equal to the second predetermined value is a boron ion, a phosphorus ion or an arsenic ion.

In order to solve the above problems, a further technique scheme of the disclosure provides a liquid crystal display panel, which includes: an array substrate, a color filter substrate and a liquid crystal layer disposed between the array substrate and the color filter substrate, the array substrate comprises a low temperature polysilicon active layer, a gate layer, an inter layer dielectric layer, a source layer and a drain layer formed on a substrate, the inter layer dielectric layer is disposed on the low temperature polysilicon active layer, the source layer and the drain layer is disposed on the inter layer dielectric layer, the gate layer is disposed under the low temperature polysilicon active layer and between the low temperature polysilicon active layer and the inter layer dielectric layer; two vias are disposed on the inter layer dielectric layer, the low temperature polysilicon active layer comprises a source doped region and a drain doped region, the source layer and the drain layer are respectively connected to the source doped region and the drain doped region through the two vias of the inter layer dielectric layer, and controllable resistance spacer layers are disposed between the source layer and the source doped region or between the drain layer and the drain doped region, wherein when a turn-on signal is not applied to the gate layer, the controllable resistance spacer layers serve as a blocking action for a flowing current, and when the turn-on signal is applied to the gate layer, controllable resistance spacer layers serve as a conducting action for the flowing current.

In one embodiment, the controllable resistance spacer layers are respectively disposed between the source layer and the source doped region, between the drain layer and the drain doped region, between the source layer and the inter layer dielectric layer and between the drain layer and the inter layer dielectric layer.

In one embodiment, the controllable resistance spacer layers are an amorphous silicon layer, a concentration of an implanted ion of the source doped region and the drain doped region is greater than or equal to a first predetermined value, and the implanted ion is a boron ion, a phosphorus ion or an arsenic ion.

In one embodiment, the controllable resistance spacer layers are an amorphous silicon layer, a concentration of an implanted ion of the source doped region and the drain doped region is less than a first predetermined value, and the implanted ion is a boron ion, a phosphorus ion or an arsenic ion; an implanted ion with a concentration greater than or equal to a second predetermined value is doped to a side of the controllable resistance spacer layers positioned between the source layer and the source doped region near the source layer, an implanted ion with a concentration greater than or equal to a second predetermined value is doped to the drain layer and the drain doped region near the drain layer, and the implanted ion with the concentration greater than or equal to the second predetermined value is a boron ion, a phosphorus ion or an arsenic ion.

The beneficial effect of the disclosure is: distinguishing from the prior art, in the manufacturing method of the array substrate of the disclosure, the controllable resistance spacer layers are formed on the source doped region or the drain doped region of the low temperature polysilicon active layer, such that a doped region formed of the controllable resistance spacer layers is connected the corresponding source layer and the corresponding drain through the controllable resistance spacer layers wherein when a turn-on signal is not applied to the gate layer, the controllable resistance spacer layers serve as a blocking action for a flowing current, thereby effectively blocking a charge carrier of the low temperature polysilicon active layer, thus decreasing the leakage of the thin film device.

BRIEF DESCRIPTION OF THE DRAWINGS

In order to more clearly illustrate the prior art or the embodiments or aspects of the practice of the disclosure, the accompanying drawings for illustrating the prior art or the embodiments of the disclosure are briefly described as below. It is apparently that the drawings described below are merely some embodiments of the disclosure, and those skilled in the art may derive other drawings according the drawings described below without creative endeavor. In drawings.

DETAILED DESCRIPTION

The disclosure will now be combined with the drawings and the embodiments to describe in details as follows.

Figure 1:
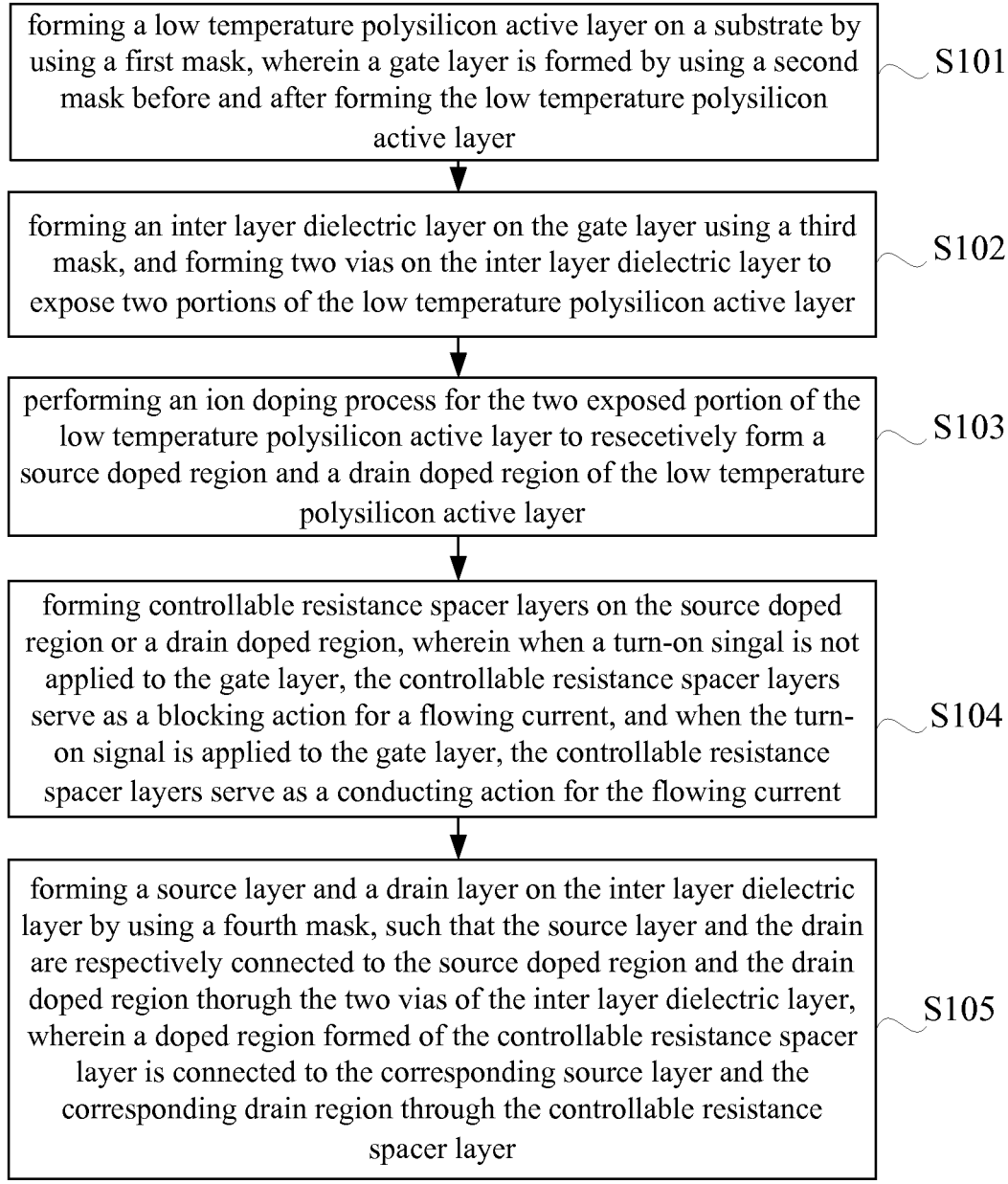
FIG. 1 is a flowchart of a manufacturing method of an array substrate according to an embodiment of the disclosure.
Figure 2:
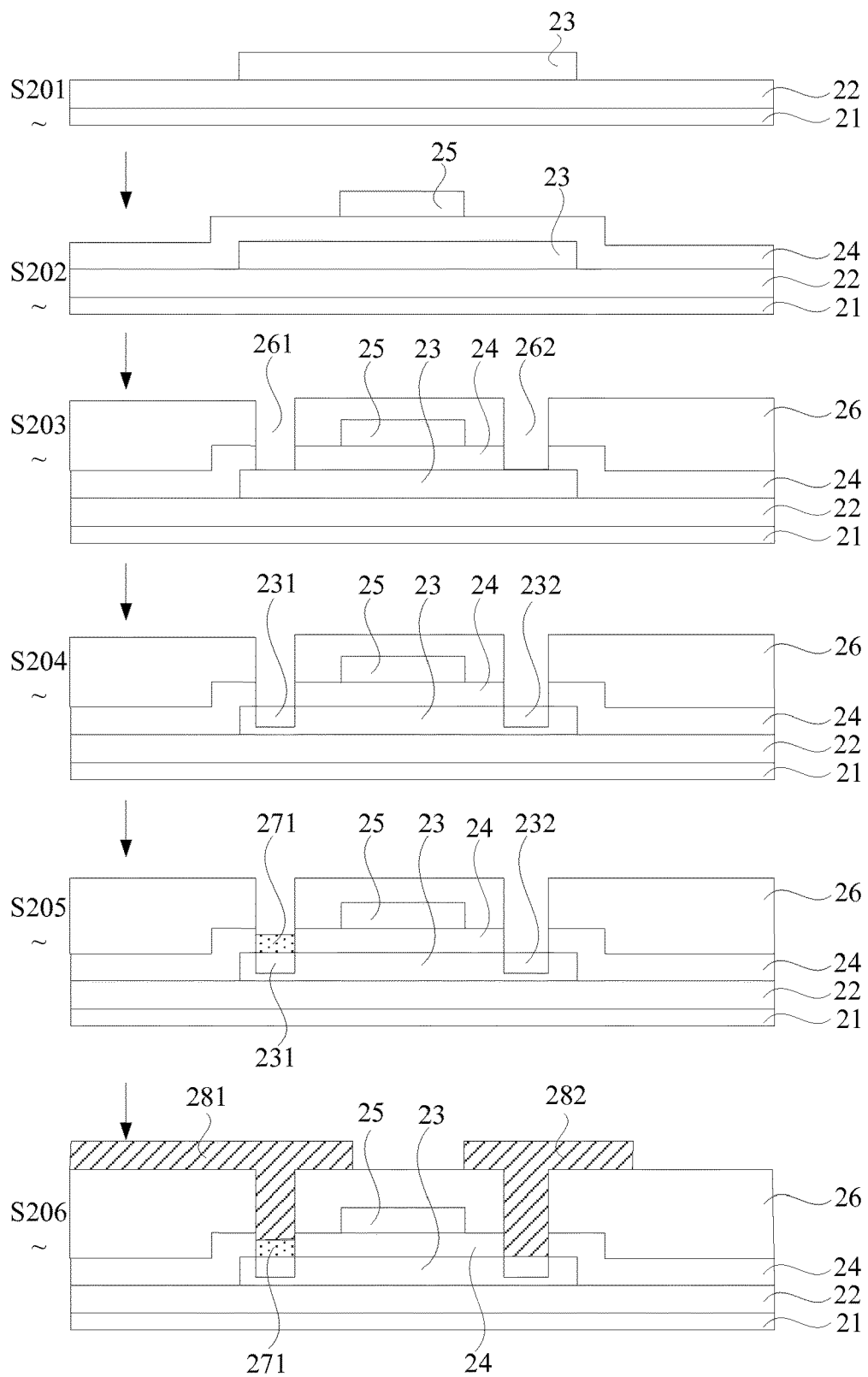
FIG. 2 is a structure schematic view of the manufacturing method of the array substrate according to an embodiment of the disclosure.

Refer to FIG. 1 and FIG. 2. FIG. 1 is a flowchart of a manufacturing method of an array substrate according to an embodiment of the disclosure and FIG. 2 is a structure schematic view of the manufacturing method of the array substrate. The manufacturing method includes the following steps:

Step S101: forming a low temperature polysilicon active layer on a substrate by using a first mask, wherein a gate layer is formed by using a second mask before and after forming the low temperature polysilicon active layer.

In conjunction with the step S201 as shown in FIG. 2, the substrate is a glass substrate. Further, in the embodiment, first, a buffer layer 22 is formed on the low temperature polysilicon 21 before forming low temperature polysilicon active layer 23, and the buffer layer 22 serves a buffer action to avoid damaging the subsequent etching process for the substrate 21. After the buffer layer 22 is formed, the low temperature polysilicon active layer 23 is formed on the buffer layer 22.

The process of forming the low temperature polysilicon active layer is as following: an amorphous silicon layer is deposited on the buffer layer 22, a photoresist layer is then formed on the amorphous silicon layer, a lighting is performed for the photoresist layer by using a first mask with a pattern of the low temperature polysilicon active layer, the photoresist layer after lighting is processed by using a developer, so as to form the pattern of the low temperature polysilicon active layer on the photoresist layer, and the amorphous silicon layer without covering the photoresist layer is etched to form the pattern of the low temperature polysilicon active layer on the amorphous silicon layer, and the photoresist layer on the amorphous silicon layer is removed, thereby obtaining the amorphous silicon layer with the pattern of the low temperature polysilicon active layer.

In the embodiment, the thin film transistor is a top gate type thin film transistor. As shown the step in FIG. 2, after the low temperature polysilicon active layer 23, a gate insulating layer 24 is formed on the low temperature polysilicon active layer 23. After the gate insulating layer 24 is formed, a gate layer 25 is formed on the gate insulating layer 24 by using a second mask.

Step S102: forming an inter layer dielectric layer on the gate layer using a third mask, and forming two vias on the inter layer dielectric layer to expose two portions of the low temperature polysilicon active layer.

Specifically, as shown the step S203 in FIG. 2, the inter layer dielectric (ILD) layer 26 is formed on the gate layer 25 by using the third mask, and two vias 261 and 262 is formed on the inter layer dielectric layer 26. Then, a portion of the gate insulating layer 24 corresponding to two vias 261 and 262 of the inter layer dielectric layer 26 is removed through the etching manner, thereby also forming two vias on the gate insulating layer 24 correspondingly, so as to expose the two portions of the low temperature polysilicon active layer 23.

Step S103: performing an ion doping process for the two exposed portion of the low temperature polysilicon active layer to resecetively form a source doped region and a drain doped region of the low temperature polysilicon active layer.

As shown in the step S203 in FIG. 2, the ion doping process is performed for the two exposed portion of the low temperature polysilicon active layer 23 to respectively form a source doped region 231 and a drain doped region 232 of the low temperature polysilicon active layer 23.

Step S104: forming controllable resistance spacer layers on the source doped region or a drain doped region, wherein when a turn-on signal is not applied to the gate layer, the controllable resistance spacer layers serve as a blocking action for a flowing current, and when the turn-on signal is applied to the gate layer, the controllable resistance spacer layers serve as a conducting action for the flowing current.

Wherein, one controllable resistance spacer layer may be formed on the source doped region or the drain doped region, or one controllable resistance spacer layer may be respectively formed on both the source doped region and the drain doped region.

In the embodiment, as shown the step s205 in FIG. 2, one controllable resistance spacer layer 271 is formed on the source doped region 231. When a turn-on signal is not applied to the gate layer 25, the controllable resistance spacer layer 271 serves as a blocking action for a flowing current, and when the turn-on signal is applied to the gate layer 25, the controllable resistance spacer layer 271 serves as a conducting action for the flowing current.

Step S105: forming a source layer and a drain layer on the inter layer dielectric layer by using a fourth mask, such that the source layer and the drain are respectively connected to the source doped region and the drain doped region through the two vias of the inter layer dielectric layer, wherein a doped region formed of the controllable resistance spacer layer is connected to the corresponding source layer and the corresponding drain region through the controllable resistance spacer layer.

As shown the step S206 in FIG. 2, a source layer 281 and a drain layer 282 are formed on the inter layer dielectric layer 26 by using a fourth mask, wherein the source layer 281 is connected to the source doped region 231 of the low temperature polysilicon active layer 23 through in turn the via 261 of the inter layer dielectric layer 26 and the via of the gate insulating layer 24, and the drain layer 282 is connected to the drain doped region 232 of the low temperature polysilicon active layer 23 through in turn the via 262 of the inter layer dielectric layer 26 and the via of the gate insulating layer 24. Since the controllable resistance spacer layer 271 is formed on the source doped region 231, the source layer 281 is connected to the source doped region 231 through the controllable resistance spacer layer 271.

The gate layer 25, the source layer 281 and the drain layer 282 respectively serves as a gate, a source and a drain of a thin film transistor on the array substrate.

In the embodiment, by disposing the controllable resistance spacer layer 271 between the source layer 281 and the source doped region 234 of the low temperature polysilicon active layer 23, and when a turn-on signal is not applied to the gate layer 25, the controllable resistance spacer layer 271 serves as a blocking action for a flowing current, thereby achieving a blocking effect for a charge carrier of the low temperature polysilicon active layer 23, thus decreasing the leakage of the thin film transistor. When the turn-on signal is applied to the gate layer 25, the controllable resistance spacer layer 271 serves as a conducting action for the flowing current, thus the source layer 281 and the drain layer 282 are conducted.

Figure 3:
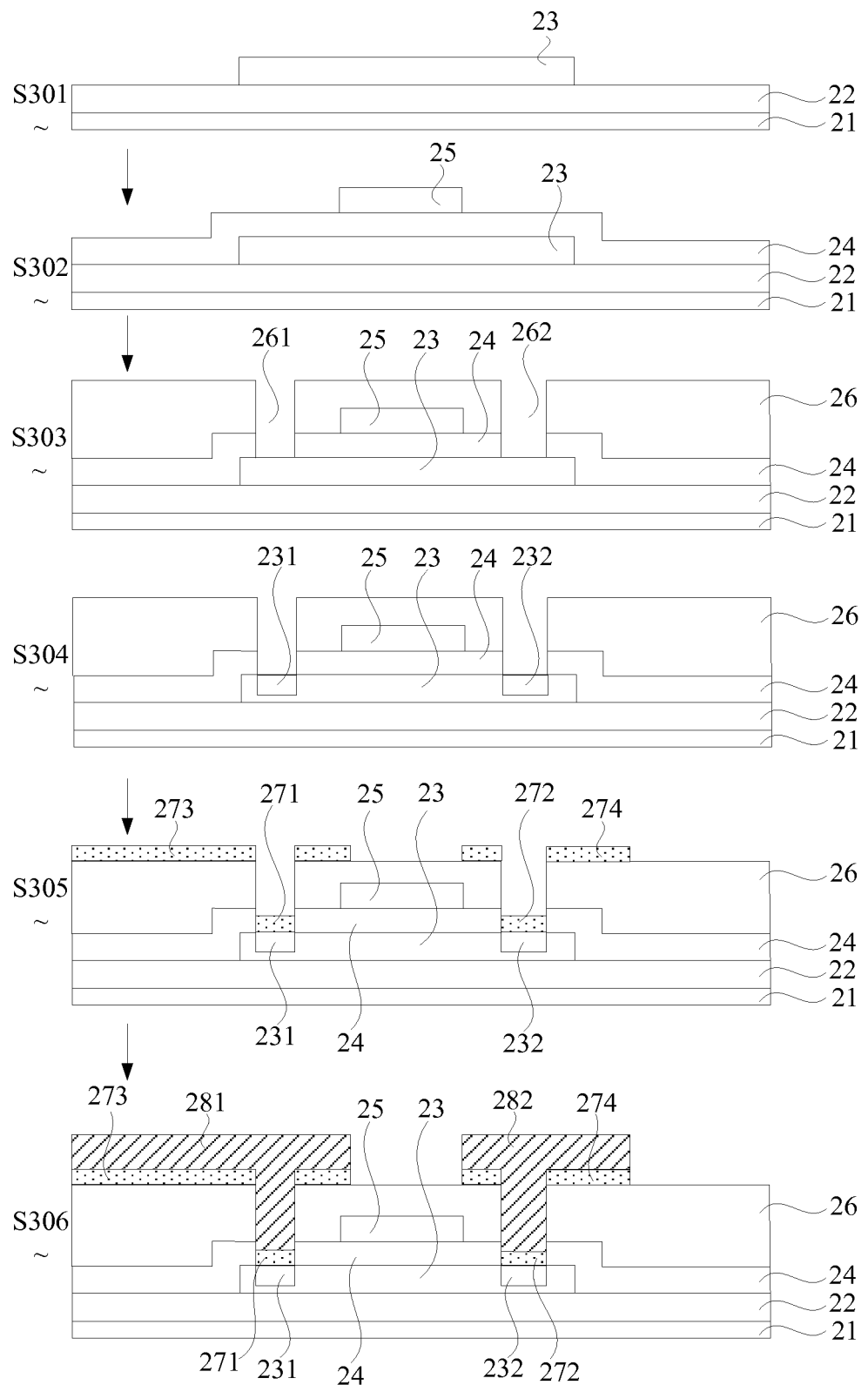
FIG. 3 is a structure schematic view of the manufacturing method of the array substrate according to another embodiment of the disclosure.

Refer to FIG. 3. FIG. 3 is a structure schematic view of the manufacturing method of the array substrate according to another embodiment of the disclosure, wherein the elements having the same reference numerals in figure have the same function. As shown in FIG. 3, in the embodiment of the manufacturing method of the array substrate of the disclosure, in the step S301, a low temperature polysilicon active layer 23 is formed. In the step S302, a gate layer 25 is formed, and a gate insulating layer 24 is disposed between the gate layer 25 and the low temperature polysilicon active layer 23. In the step S303, an inter layer dielectric layer 26 is formed to expose two portions of the low temperature polysilicon active layer 23. In the step S304, performing an ion doping process for the exposed low temperature polysilicon active layer 23 to form a source doped region 231 and a drain doped region 232 of the low temperature polysilicon active layer.

In the embodiment, the step of performing the ion doping process for the exposed low temperature polysilicon active layer 23 is as following: performing an ion implantation for the exposed low temperature polysilicon active layer. Namely, the exposed low temperature polysilicon active layer 23 is doped by using the ion implantation manner, and during the implantation process, the inter layer dielectric layer 26 serves as a mask to perform the ion implantation, and thus the ion implantation may be completed without increasing the additional mask. A concentration of the ion is greater than or equal to a first predetermined value, i.e. the doping is performed by using the ion with high concentration, such that the source doped region and the drain doped region are a heavily doped region (P+). It is understood that the first predetermined value is capable of making the source doped region and the drain doped region to serve as a boundary value of ion concentration of the heavily doped region, which may be chosen according to the actual need.

In the embodiment, the implanted ion is a boron ion, and of course, is also a phosphorus ion or an arsenic ion. Moreover, the amount of implanted ion and the use of the implantation power can be controlled to adjust the penetration depth of the implanted ion in the low temperature polysilicon active layer 23.

In the embodiment, the step of forming the controllable resistance spacer layer on the source doped region and the drain doped region is as following: the controllable resistance spacer layer is formed on both the source doped region and the drain doped region, and two controllable resistance spacer layers corresponding to the source layer and the drain layer are formed on the inter layer dielectric layer by using the fourth mask.

As shown the step S305 in FIG. 3, in addition to the controllable resistance spacer layer 271 is formed on the source doped region 231, the controllable resistance spacer layer 272, 273 and 274 are also respectively formed on the drain doped region 231 and the inter layer dielectric layer 26. The controllable resistance spacer layer 273 and 274 respectively corresponds to the source layer 281 and the drain layer 282. Furthermore, the fourth mask used for forming the controllable resistance spacer layer 273 and 274 on the inter layer dielectric layer is the same as the mask used for forming the source layer 281 and 282.

As shown the step S306 in FIG. 3, the step of forming the source layer and the drain layer on the inter layer dielectric layer by using the fourth mask includes: forming the source layer 281 and the drain layer 282 respectively on the two controllable resistance spacer layer 273 and 274 of the inter layer dielectric layer 26, and the source layer 281 and the drain layer 282 are connected to the source doped region 231 and the drain doped region 232 through the controllable resistance spacer layers 271 and 274.

Therefore, the controllable resistance spacer layers are respectively formed between the source layer 281 and the source doped region 231, between the source layer 281 and the inter layer dielectric layer 26, between the drain layer 282 and the drain doped region 232 and between the drain layer 282 and the inter layer dielectric layer 26, thereby further decreasing the leakage of the thin film transistor. In the embodiment, the controllable resistance spacer layers 273, 274 on the inter layer dielectric layer 26 and the source 281, 282 are formed by using the same mask, thereby decreasing the amount of the mask and simplifying the process.

In the embodiment, the controllable resistance spacer layer is an amorphous silicon layer (a-si), an ohmic contact of the source layer 281 and the drain layer 282 are corrected through the amorphous silicon layer, so as to decrease the leakage effectively.

Figure 4:
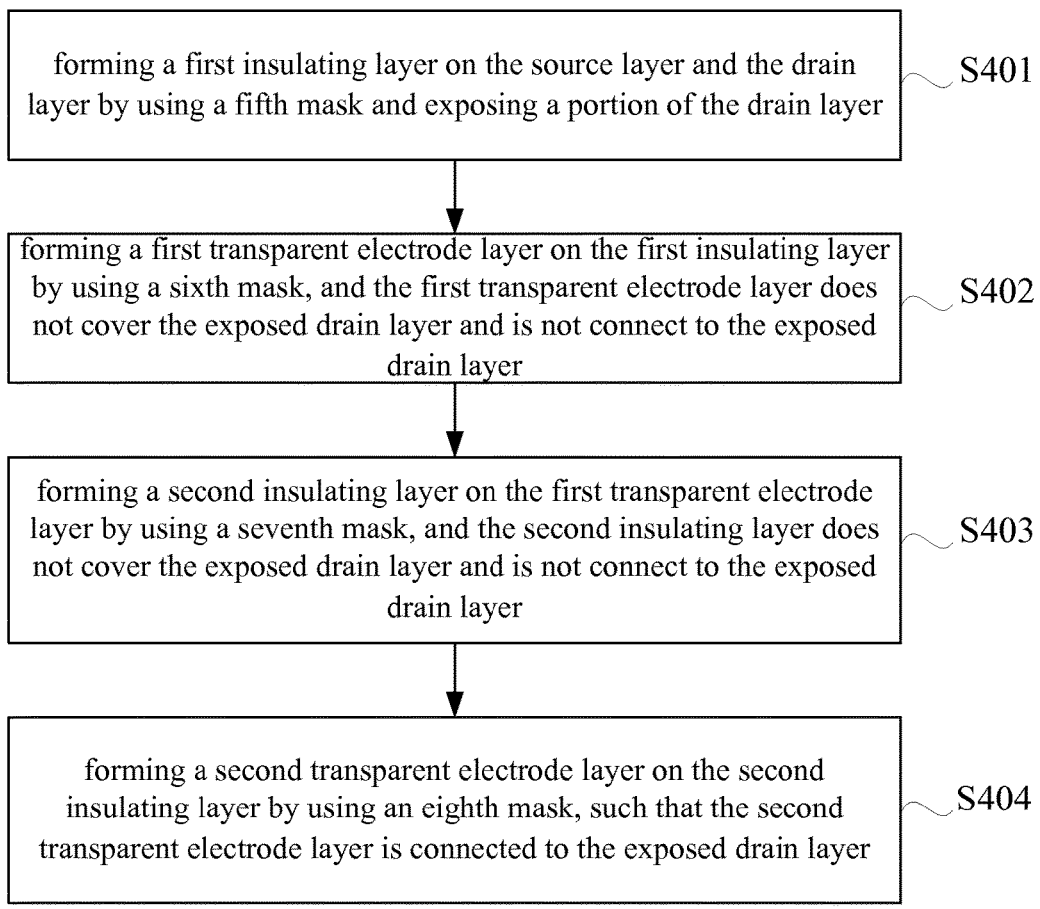
FIG. 4 is a flowchart of the step after the step of forming a source layer and a drain layer on two controllable resistance spacer layers of the inter layer dielectric layer by using a third mask to respectively connect the source layer and the drain layer to a source doped region and a drain doped region in the manufacturing method of the array substrate according to another embodiment of the disclosure.
Figure 5:
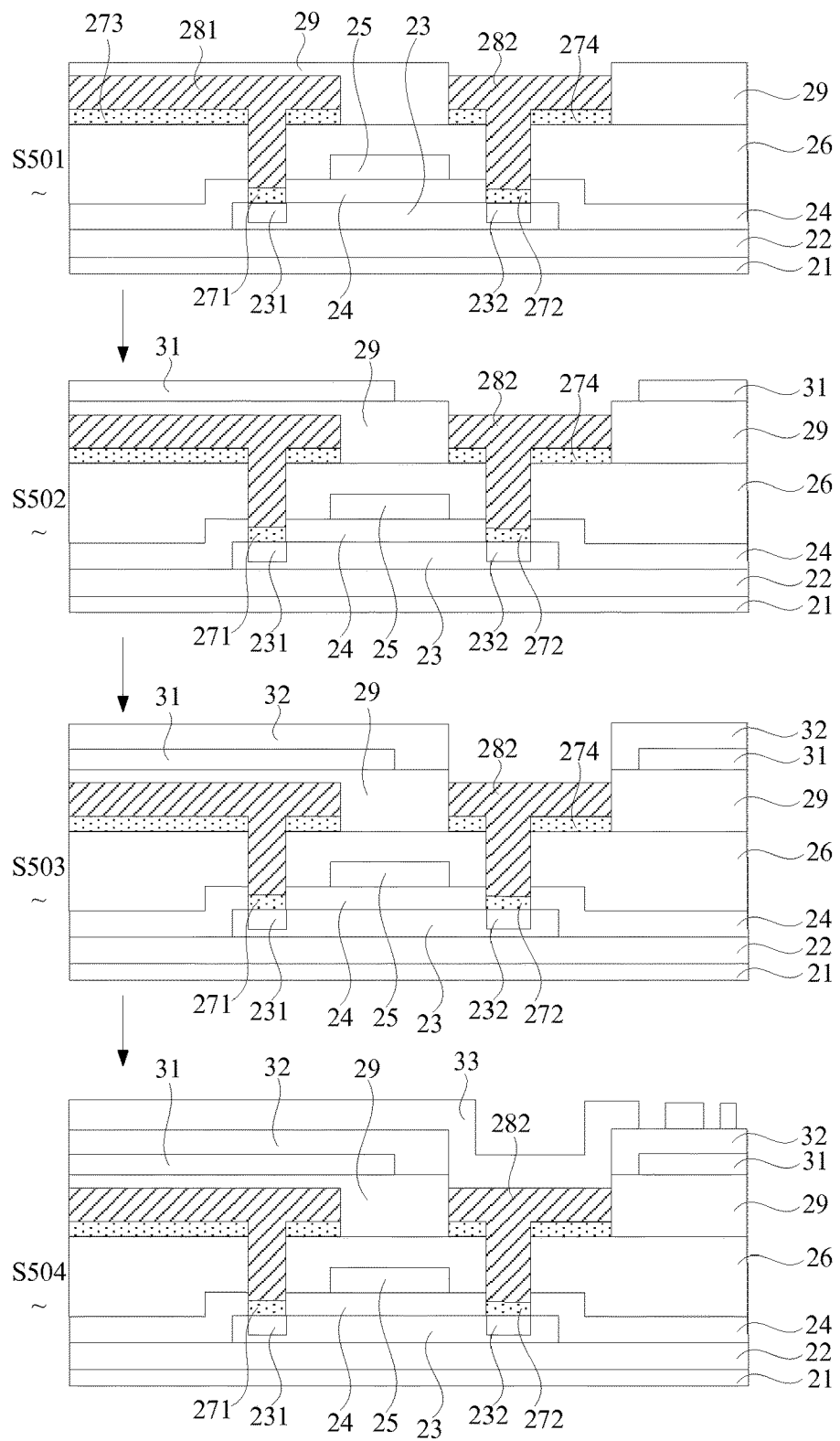
FIG. 5 is structure schematic view of the step after the step of forming a source layer and a drain layer on two controllable resistance spacer layers of the inter layer dielectric layer by using a third mask to respectively connect the source layer and the drain layer to a source doped region and a drain doped region in the manufacturing method of the array substrate according to another embodiment of the disclosure.

Further, refer to FIG. 4 and FIG. 5 in conjunction with FIG. 3, in the embodiment, after the step S306 as shown in FIG. 3, i.e. after the step of forming the source layer and the drain layer respectively on the two controllable resistance spacer layer of the inter layer dielectric layer, such that the source layer and the drain layer are respectively connected to the source doped region and the drain doped region, as shown in FIG. 4, the step further includes the following steps:

Step S401: forming a first insulating layer on the source layer and the drain layer by using a fifth mask and exposing a portion of the drain layer.

As shown the step S501 in FIG. 5, a first insulating layer 29 is formed on the source layer 281 and the drain layer 282 by using a fifth mask and exposing a portion of the drain layer 282. In the embodiment as shown in FIG. 5, the first insulating layer 29 is formed on the source layer 281 and the exposed inter layer dielectric layer 26, the first insulating layer 29 is not formed on the drain layer 282, such that the drain layer 282 is exposed. In other embodiments, the first insulating layer 29 may also be formed on the drain layer 282, as long as at least a portion of the drain layer 282 can be exposed, such that the subsequent drain layer 282 is connected to a pixel electrode of the array substrate.

Step S402: forming a first transparent electrode layer on the first insulating layer by using a sixth mask, and the first transparent electrode layer does not cover the exposed drain layer and is not connect to the exposed drain layer.

As shown the step S502 in FIG. 5, the first transparent electrode layer 31 is formed on the first insulating layer 29 by using the sixth mask, and the first transparent electrode layer 31 is formed by using ITO material. When the first transparent electrode layer 31 is formed, the first transparent electrode layer 31 does not cover the exposed drain layer 282 and is not connect to the exposed drain layer 282.

The first transparent electrode layer 31 is a common electrode layer of the array substrate.

Step S403: forming a second insulating layer on the first transparent electrode layer by using a seventh mask, and the second insulating layer does not cover the exposed drain layer and is not connect to the exposed drain layer.

As shown the step S503 in FIG. 5, the second insulating layer 32 is formed on the first transparent electrode layer 31 by using the seventh mask, and the second insulating layer 32 does not cover the exposed drain layer 282, such that at least a portion of the drain layer 282 is exposed.

Step S404: forming a second transparent electrode layer on the second insulating layer by using an eighth mask, such that the second transparent electrode layer is connected to the exposed drain layer.

As shown the step S504 in FIG. 5, the second transparent electrode layer 33 is formed on the second insulating layer 32 by using the eighth mask, such that the second transparent electrode layer 33 is connected to the exposed drain layer 282. The second transparent electrode layer 33 is a pixel electrode layer of the array substrate, thereby achieving the connection of the pixel electrode layer and the drain layer 282, so as to achieve a thin film transistor for driving the pixel electrode layer.

In the embodiment, the formation from the thin film transistor to the pixel electrode layer only needs eight masks to complete. Compared with the conventional CMOS process, the disclosure reduces 3 to 4 masks. It is advantageous to decrease the amount of masks, and it is capable of simplifying the process and increasing performance of the device at the same time.

In other embodiment, the gate layer may be formed before forming the low temperature polysilicon active layer, i.e. firstly, the gate layer is formed on the substrate, the gate insulating layer is formed on the gate layer, the low temperature polysilicon active layer is formed on the gate insulating layer, and the inter layer dielectric layer is then formed on the low temperature polysilicon active layer. Namely, the thin film transistor may also be a bottom gate type thin film transistor.

Furthermore, in the embodiment, the controllable resistance spacer layer may also be other semiconductor layer, e.g., the semiconductor layer having a germanium element, or may also be a compound semiconductor layer, such as the semiconductor layer having a gallium arsenide, a gallium phosphide, etc.

Figure 6:
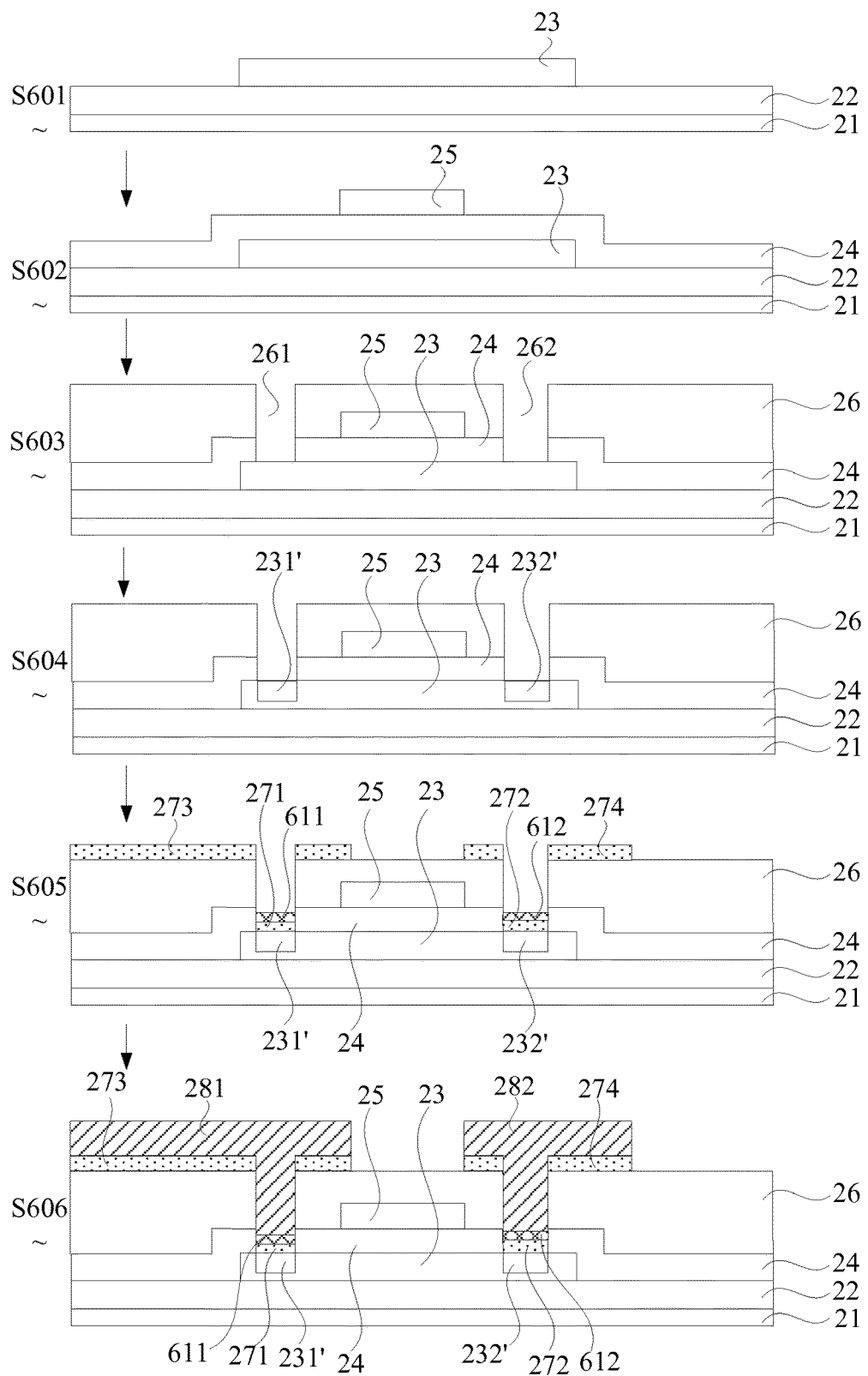
FIG. 6 is a structure schematic view of the manufacturing method of the array substrate according to another embodiment of the disclosure.

Refer to FIG. 6. FIG. 6 is a structure schematic view of the manufacturing method of the array substrate according to another embodiment of the disclosure, wherein the elements having the same reference numerals in figure have the same function. In the embodiment, different from the above embodiment, the ion doping process is performed for the controllable resistance spacer layers on the source doped region 231 and drain doped region 232.

Specifically, in the embodiment, as shown in FIG. 6, in the step S601, the buffer layer 22 is formed on the substrate 21, and the low temperature polysilicon active layer 23 is then formed on the buffer layer 22 by using the first mask.

In the step S602, the gate insulating layer 24 is formed on the low temperature polysilicon active layer 23, and the gate layer 25 is then formed on the gate insulating layer 24 by using the second mask.

In the step S603, the inter layer dielectric layer 26 is formed on the gate layer 25, two vias 261 and 262 are formed on the inter layer dielectric layer 26, and a portion of the gate insulating layer 24 corresponding to the two vias 261 and 262 is removed to expose two portions of the low temperature polysilicon active layer 23.

In the step S603, the ion doping process is performed for the two exposed portion of the low temperature polysilicon active layer 23 to respectively form a source doped region 231' and a drain doped region 232' of the low temperature polysilicon active layer 23.

The ion doping is performed for the exposed low temperature polysilicon active layer 23 by using the ion implantation manner. In the embodiment, a concentration of the ion implanted to the low temperature polysilicon active layer 23 is less a first predetermined value, i.e. the doping is performed by using the ion with low concentration, such that the source doped region 231' and the drain doped region 232' are a lightly doped region (P–), i.e. a structure of a lightly doped drain (LDD) is formed on the low temperature polysilicon active layer 23. The implanted ion is a boron ion, of course, may also be a phosphorus ion or an arsenic ion.

In the step S605, the controllable resistance spacer layers 271, 272 are respectively formed on the source doped region 231' and the drain doped region 232' and the controllable resistance spacer layers 273, 274 corresponding to the source layer 281 and the drain layer 282 are respectively formed on the inter layer dielectric layer 26 by using the fourth mask. The controllable resistance spacer layers 271-274 are an amorphous silicon layer.

Further, in the embodiment, after the controllable resistance spacer layers 271, 272 are respectively formed on the source doped region 231' and the drain doped region 232', the ion implantation is performed for the controllable resistance spacer layers 271, 272 on the source doped region 231' and the drain doped region 232', and the ion doping is performed for the for the controllable resistance spacer layers 271, 272, thereby respectively forming doped regions 611, 612 on the controllable resistance spacer layers 271, 272.

When the ion implantation is performed for the controllable resistance spacer layers 271, 272, a concentration of the ion is greater than or equal to a second predetermined value, i.e. the doped regions 611, 612 on the controllable resistance spacer layers 271, 272 are heavily doped regions. The implanted ion is a boron ion, and of course, may also be a phosphorus ion or an arsenic ion. The second predetermined value is capable of making the doped regions 611, 612 to serve as a boundary value of ion concentration of the heavily doped region.

Furthermore, the controllable resistance spacer layers 271, 272 are partial-doping, i.e. the depth of the implanted ion in the controllable resistance spacer layers 271, 272 is less than the thickness of the controllable resistance spacer layers 271, 272, and the doped regions 611, 612 do not completely penetrate the controllable resistance spacer layers 271, 272.

In the step S606, the source layer 281 and the drain layer 282 are respectively formed on two amorphous silicon layer 273, 274 of the inter layer dielectric layer 26 by using the fourth mask, such that the source layer 281 and the drain 282 are respectively connected to the source doped region 231' and the drain doped region 232'. Specifically, the source layer 281 is connected to the doped region 611 on the controllable resistance spacer layer 271, so as to connect to the source doped region 231' through the controllable resistance spacer layer 271, and the drain layer 282 is connected to the controllable resistance spacer layer 272, so as to connect to the drain doped region 232' through the controllable resistance spacer layer 272.

In the embodiment, by performing the heavily doping process for the controllable resistance spacer layer 271, 272, in the final structure of the thin film transistor, e.g. at the ohmic contact of the drain layer 282, a sandwich structure of the drain doped region 232' with lightly doping, the portion of the controllable resistance spacer layer 272 without doping and the doped region 612 with heavily doping in the controllable resistance spacer layer 272 is formed. Therefore, the leakage of the thin film transistor is further improved.

Figure 7:
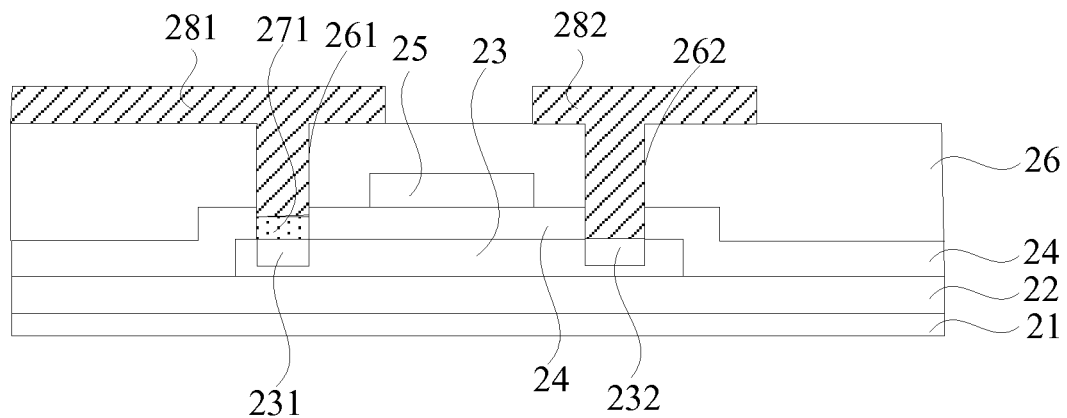
FIG. 7 is a structure schematic view of an array substrate according to an embodiment of the disclosure.

Refer to FIG. 7. FIG. 7 is a structure schematic view of an array substrate according to an embodiment of the disclosure, wherein the array substrate of the embodiment is obtained by using the manufacturing method of the array substrate of the embodiment as shown in FIG. 1. The array substrate includes a low temperature polysilicon active layer 23, a gate layer 25, an inter layer dielectric layer 26, a source layer 281 and a drain layer 282 formed on a substrate 21, the inter layer inter layer, and further includes a buffer layer 22 and a gate insulating layer 24.

The low temperature polysilicon active layer 23 is formed on the buffer layer 22, and the gate insulating layer 24 is formed on the low temperature polysilicon active layer 23. The gate layer 25 is formed on the gate insulating layer 24, the inter layer dielectric layer 26 is formed on the gate layer 25, and the source layer 281 and the drain layer 282 are formed on the inter layer dielectric layer 26. Two vias 261 and 262 are disposed on the inter layer dielectric layer 26, and the positions of the gate insulating layer 24 corresponding to two vias 261 and 262 may also have vias.

The low temperature polysilicon active layer 23 includes a source doped region 231 and a drain doped region 232. The source layer 281 is connected to the source doped region 231 through in turn the via 261 of the inter layer dielectric layer 26 and the via of the gate insulating layer 24, and the drain layer 282 is connected to the drain doped region 232 through in turn the via 262 of the inter layer dielectric layer 26 and the via of the gate insulating layer 24. The gate layer 25, the source layer 281 and the drain layer 282 respectively serves as a gate, a source and a drain of a thin film transistor on the array substrate.

In the embodiment, the controllable resistance spacer layer is disposed between the source layer 281 and the source doped region 231. When a turn-on signal is not applied to the gate layer 25, the controllable resistance spacer layer 271 serves as a blocking action for a flowing current and when the turn-on signal is applied to the gate layer 25, the controllable resistance spacer layer 271 serves as a conducting action for the flowing current. Therefore, by disposing the controllable resistance spacer layer 271, when the turn-on signal is not applied to the gate layer 25, it can block flowing current, thereby decreasing the leakage of the thin film transistor effectively.

Figure 8:
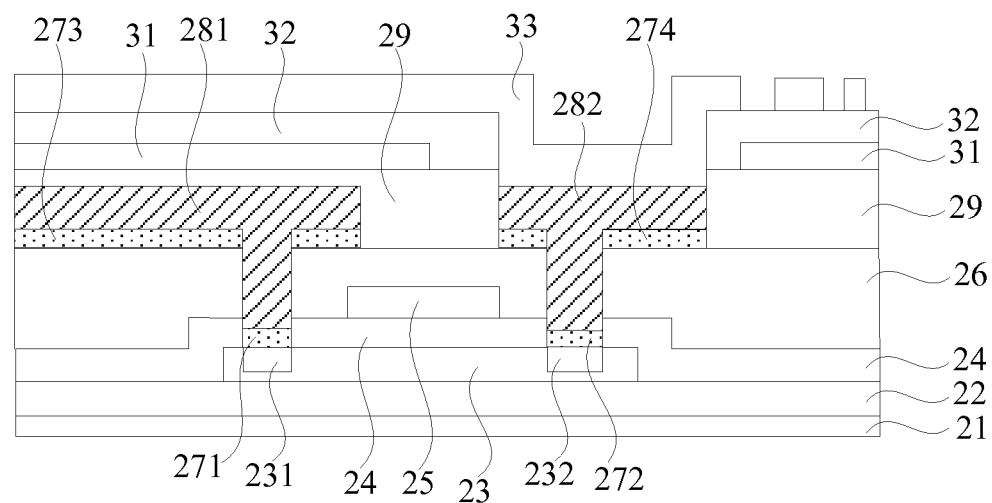
FIG. 8 is a structure schematic view of an array substrate according to another embodiment of the disclosure.

Refer to FIG. 8. FIG. 8 is a structure schematic view of an array substrate according to another embodiment of the disclosure. Further, in addition to the controllable resistance spacer layer 271 is disposed between the source layer 281 and the source doped region 231, the controllable resistance spacer layer 272, 273 and 274 are respectively disposed between the drain layer 282 and the drain doped region 232, between the source layer 281 and the inter layer dielectric layer 26 and between the drain layer 282 and the inter layer dielectric layer 26, thereby decreasing the leakage of the thin film transistor effectively.

The controllable resistance spacer layers 271-274 are an amorphous silicon layer. A concentration of the implanted ion of the source doped region 231 and the drain doped region 232 is greater than or equal to a first predetermined value, i.e. the source doped region 231 and the drain doped region 232 are a heavily doped region. The implanted ion is a boron ion, and of course, may also be a phosphorus ion or an arsenic ion.

Furthermore, a first insulating layer 29, a first transparent electrode layer 31, a second insulating layer 32 and a second transparent electrode layer 33 are further in turn formed on the source layer 281 and the drain layer 282. The second transparent electrode layer 33 is connected to the drain layer 282.

According to the array substrate of the embodiment, the first mask, the second mask, the third mask, the fourth mask, the fifth mask, the sixth mask, the seventh mask and the eighth mask are respectively used to form the low temperature polysilicon active layer 23, the gate layer 25, the inter layer dielectric layer 26, the source layer 281, the drain layer 282, the first insulating layer 29, the first transparent electrode layer 31, the second insulating layer 32 and the second transparent electrode layer 33. When the ion doping is performed for the low temperature polysilicon active layer 23 to form the source doped region 231 and the drain doped region 232, the inter layer dielectric layer 26 may be used to serves as a mask to perform the ion implantation, thus it does not need to increase the additional mask.

Therefore, in the array substrate of the embodiment, the manufacturing of the thin film device only needs eight masks to complete. It is advantageous to decrease the amount of masks, and it is capable of simplifying the process and increasing performance of the device at the same time due to the thin film transistor having the controllable resistance spacer layer is disposed.

Figure 9:
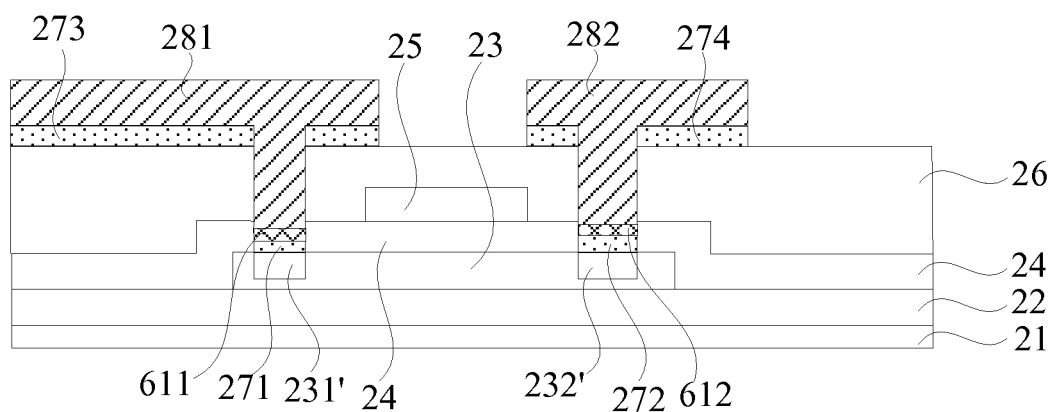
FIG. 9 is a structure schematic view of an array substrate according to a further embodiment of the disclosure.

Refer to FIG. 9, in a further embodiment of the disclosure, different from the above embodiments, the source doped region 231' and the drain doped region 232' are a lightly doped region (LDD structure), i.e. the a concentration of the ion implanted to the low temperature polysilicon active layer 23 is lower, e.g. is less than a first predetermined value, and the implanted ion may be a boron ion.

Further, as shown in FIG. 9, an implanted ion with a concentration greater than or equal to a second predetermined value is doped to a side of the controllable resistance spacer layer 271 positioned between the source layer 281 and the source doped region 231' near the source layer 281, i.e. the controllable resistance spacer layer 271 positioned between the source layer 281 and the source doped region 231' has the doped region 611. An implanted ion with a concentration greater than or equal to a second predetermined value is doped to the controllable resistance spacer layer 272 positioned between the drain layer 282 and the drain doped region 232' near the drain layer 282, i.e. the controllable resistance spacer layer 272 positioned between the drain layer 282 and the drain doped region 232' has the doped region 612. The source layer 281 is connected to the doped region 611 on the controllable resistance spacer layer 271, so as to connect to the source doped region 231' through the controllable resistance spacer layer 271, and the drain layer 282 is connected to the doped region 612 on the controllable resistance spacer layer 272, so as to connect to the drain doped region 232' through the controllable resistance spacer layer 272.

The second predetermined value is capable of making the doped regions 611, 612 to serve as a boundary value of ion concentration of the heavily doped region, i.e. the doped regions 611, 612 on the controllable resistance spacer layer 271, 272 are a heavily doped region.

The controllable resistance spacer layers 271, 272 are a part doping, i.e. the depth of the implanted ion in the controllable resistance spacer layers 271, 272 is less than the thickness of the controllable resistance spacer layers 271, 272, and the doped region 611, 612 do not completely penetrate the controllable resistance spacer layers 271, 272.

After the source layer 281 and the drain layer 282 is formed, a first insulating layer, a first transparent electrode layer, a second insulating layer and a second transparent electrode layer and the formation process may be referred to the steps as shown in FIG. 5, and thus the description is omitted.

By using the controllable resistance spacer layers of the embodiment, it is capable of further decreasing the leakage of the thin film transistor device.

It should be noted that the array substrate of the disclosure is applied to the liquid crystal display panel, the OLED display panel and other substrates having a thin film transistor device.

Figure 10:
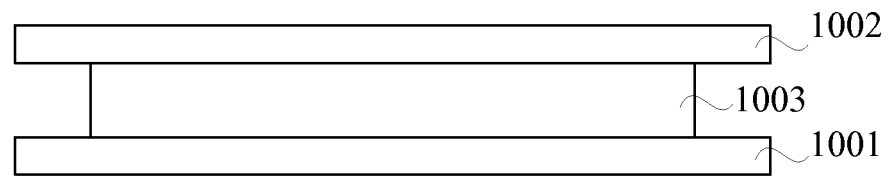
FIG. 10 is a structure schematic view of a liquid crystal display panel according to a further embodiment of the disclosure.

Refer to FIG. 10; in the embodiment of a liquid crystal display panel of the disclosure, the liquid crystal display panel includes an array substrate 1001, a color filter substrate 1002 and a liquid crystal layer 1003 disposed between the array substrate 1001 and the color filter substrate 1002. The array substrate 1001 is the array substrate of any one of the above embodiments, or the array substrate obtained by using the manufacturing method of the array substrate of any one of the above embodiments.

The above disclosures only are the preferred embodiments of the disclosure it can not be used to limit the scope of the disclosure as claimed, Therefore, the equivalent changes is made according to the disclosure as claimed, the scope of the disclosure is still covered.

What is claimed is:

1. An array substrate, comprising: a low temperature polysilicon active layer, a gate layer, an inter layer dielectric layer, a source layer and a drain layer formed on a substrate; wherein the inter layer dielectric layer is disposed on the low temperature polysilicon active layer, the source layer and the drain layer is disposed on the inter layer dielectric layer, and the gate layer is disposed on the low temperature polysilicon active layer and between the low temperature polysilicon active layer and the inter layer dielectric layer;
   wherein two vias are disposed on the inter layer dielectric layer, the low temperature polysilicon active layer comprises a source doped region and a drain doped region, the source layer and the drain layer are respectively connected to the source doped region and the drain doped region through the two vias of the inter layer dielectric layer, and controllable resistance spacer layers are disposed between the source layer and the source doped region or between the drain layer and the drain doped region while being not disposed between the source layer and the inter layer dielectric layer, and not disposed between the drain layer and the inter layer dielectric layer; wherein when a turn-on signal is not applied to the gate layer, the controllable resistance spacer layers serve as a blocking action for a flowing current, and when the turn-on signal is applied to the gate layer, the controllable resistance spacer layers serve as a conducting action for the flowing current.

2. The array substrate according to claim 1, wherein the controllable resistance spacer layers are an amorphous silicon layer, a concentration of an implanted ion of the source doped region and the drain doped region is greater than or equal to a first predetermined value, and the implanted ion is a boron ion, a phosphorus ion or an arsenic ion.

3. The array substrate according to claim 1, wherein the controllable resistance spacer layers are an amorphous silicon layer, a concentration of an implanted ion of the source doped region and the drain doped region is less than a first predetermined value, and the implanted ion is a boron ion, a phosphorus ion or an arsenic ion;
   an implanted ion with a concentration greater than or equal to a second predetermined value is doped to a side of the controllable resistance spacer layers positioned between the source layer and the source doped region near the source layer, an implanted ion with a concentration greater than or equal to a second predetermined value is doped to the drain layer and the drain doped region near the drain layer, and the implanted ion with the concentration greater than or equal to the second predetermined value is a boron ion, a phosphorus ion or an arsenic ion.

4. A liquid crystal display panel, comprising: an array substrate, a color filter substrate and a liquid crystal layer disposed between the array substrate and the color filter substrate, wherein the array substrate comprises a low temperature polysilicon active layer, a gate layer, an inter layer dielectric layer, a source layer and a drain layer formed on a substrate, the inter layer dielectric layer is disposed on the low temperature polysilicon active layer, the source layer and the drain layer is disposed on the inter layer dielectric layer, the gate layer is disposed on the low temperature polysilicon active layer and between the low temperature polysilicon active layer and the inter layer dielectric layer;
   two vias are disposed on the inter layer dielectric layer, the low temperature polysilicon active layer comprises a source doped region and a drain doped region, the source layer and the drain layer are respectively connected to the source doped region and the drain doped region through the two vias of the inter layer dielectric layer, and controllable resistance spacer layers are disposed between the source layer and the source doped region or between the drain layer and the drain doped region while being not disposed between the source layer and the inter layer dielectric layer, and not disposed between the drain layer and the inter layer dielectric layer, wherein when a turn-on signal is not applied to the gate layer, the controllable resistance spacer layers serve as a blocking action for a flowing current, and when the turn-on signal is applied to the gate layer, the controllable resistance spacer layers serve as a conducting action for the flowing current.

5. The liquid crystal display panel according to claim 4, wherein the controllable resistance spacer layers are an amorphous silicon layer, a concentration of an implanted ion of the source doped region and the drain doped region is greater than or equal to a first predetermined value, and the implanted ion is a boron ion, a phosphorus ion or an arsenic ion.

6. The liquid crystal display panel according to claim 4, wherein the controllable resistance spacer layers are an amorphous silicon layer, a concentration of an implanted ion of the source doped region and the drain doped region is less than a first predetermined value, and the implanted ion is a boron ion, a phosphorus ion or an arsenic ion;
   an implanted ion with a concentration greater than or equal to a second predetermined value is doped to a side of the controllable resistance spacer layers positioned between the source layer and the source doped region near the source layer, an implanted ion with a concentration greater than or equal to a second predetermined value is doped to the drain layer and the drain doped region near the drain layer, and the implanted ion with the concentration greater than or equal to the second predetermined value is a boron ion, a phosphorus ion or an arsenic ion.

* * * * *